United States Patent [19]

Iacovangelo

[11] Patent Number: 4,746,375

[45] Date of Patent: May 24, 1988

[54] ACTIVATION OF REFRACTORY METAL SURFACES FOR ELECTROLESS PLATING

[75] Inventor: Charles D. Iacovangelo, Niskayuna, N.Y.

[73] Assignee: General Electric Company, Schenectady, N.Y.

[21] Appl. No.: 47,739

[22] Filed: May 8, 1987

[51] Int. Cl.$^4$ .................................................. C21D 1/74
[52] U.S. Cl. ...................................... 148/20.3; 427/305
[58] Field of Search ....................... 427/304, 305, 319; 148/15.5, 16.5, 19, 20, 20.3, 20.6, 133, 444, 419.7

[56] References Cited

U.S. PATENT DOCUMENTS 3,772,096  11/1973  Maquelin ............................ 148/6.3

OTHER PUBLICATIONS

Herron et al, "Dephosphorization and Decarburization of Electroless Nickel Deposits by Heat Treatment in Special Atmospheres", IBM Technical Disclosure Bulletin, vol. 23, No. 9, Feb. 1981.

*Primary Examiner*—Christopher W. Brody
*Attorney, Agent, or Firm*—Francis T. Coppa; James C. Davis, Jr.; James Magee, Jr.

[57] ABSTRACT

A method of catalytically activating refractory metal surfaces for the subsequent electroless plating of another metal thereon is disclosed, in which the refractory surface is treated while heated in a carburizing atmosphere under conditions which cause the formation of refractory metal carbides on the refractory surface.

8 Claims, No Drawings

ACTIVATION OF REFRACTORY METAL SURFACES FOR ELECTROLESS PLATING

BACKGROUND OF THE INVENTION

This invention relates to the treatment of refractory metal surfaces for subsequent electroless plating of metal on the surface.

Ceramic chip carriers are rapidly gaining popularity for use in the packaging of semiconductor chips. These carriers typically include alumina-based substrates and have discrete areas of multilayer metallization bonded to the ceramic substrate. Generally, the areas of metallization comprise, in sequence, a base metallization layer bonded to the ceramic substrate, a layer of nickel bonded to the base layer, and a layer of gold bonded to the nickel layer. Tungsten and molybdenum are generally the metals of choice for the base layer. Furthermore, electroless deposition is often the method of choice for applying nickel to the base layer.

Since tungsten and molybdenum are not active metals for the electroless deposition of nickel thereon, an activation step prior to the nickel deposition is required. Prior art methods of activation generally involve the addition of an activator to the refractory material. For example, one activation method of the prior art calls for the chemisorption of palladium onto the refractory metal surface after a long series of cleaning steps. While indeed activating the surface, this process is extremely cumbersome and difficult to control.

Another method of activation employed in the past involves the mixing of an activating material such as nickel, copper or palladium to the metallized ink composition which is then applied to the ceramic sheets to form the tungsten or molybdenum layer. This method also exhibits several drawbacks. For example, severe shrinkage of the metallization may occur, causing warpage of the ceramic part and consequent delamination of the refractory metal from the ceramic surface.

It is another object of the present invention to provide a refractory surface activation method which does not require the addition of activating agents to the refractory metal.

It is still another object to provide a simplified process for altering the chemical characteristics of a tungsten or molybdenum surface layer to render it active for the subsequent electroless deposition of a metal.

DETAILED DESCRIPTION OF THE INVENTION

The surface of refractory metals such as tungsten or molybdenum may be catalytically activated by exposing a heated metal surface to a carburizing atmosphere under conditions which cause carbon to react with refractory metal atoms at the surface.

A "carburizing atmosphere" as used herein is defined as an atmosphere containing a decomposable carbon-containing compound, such that free carbon reacts with some of the atoms of a refractory surface to form a metal carbide. As further described below, the refractory surface is heated to relatively high temperatures during this treatment, causing the compound to pyrolyze.

Illustrative decomposable carbon-containing compounds include linear or branched hydrocarbon gases, as well as carbon oxides. Mixtures of carbon-containing materials are also possible. In preferred embodiments of the present invention, the carbon source is a gas. However, carbon-containing materials which are liquid or solid at room temperature may also be utilized if free carbon is liberated from these materials at the elevated temperatures described below.

Short chain alkanes such as methane, ethane, propane and butane are the preferred carbon sources for the present invention. Of these compounds, methane is most preferred because of the ease with which it "cracks" or dissociates at elevated temperatures. However, propane is also a very suitable carbon source when methane is unavailable.

Although the carburizing environment may consist of only the carbon-containing material, it is often desirable to include molecular hydrogen in the atmosphere. The hydrogen (i.e., that which is in addition to hydrogen already associated with the carbon source), functions as a reducing gas to convert any refractory metal oxides to the respective metal.

Catalytic activation of the refractory metal surface is accomplished by treatment according to the present invention by allowing carbon to react with the refractory metal atoms on the surface, i.e., to carburize the surface.

Carburization results in the formation of refractory metal carbides on the surface of the substrate. The chemically altered surface is highly catalytic to the subsequent electroless deposition of metals such as cobalt, nickel, and gold.

Treatment of the refractory metal surface in a carburizing atmosphere is thought to involve one or more of the following exemplary reactions when the indicated carbon sources are used. Although tungsten is exemplified in these reaction equations, those skilled in the art appreciate that molybdenum undergoes similar reactions and forms analogous products.

   (1)

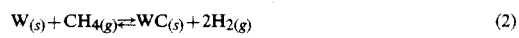   (2)

By balancing the components in the carburizing environment, metal carbide formation at the refractory surface is favored.

Such balancing is also important for minimizing the occurence of reactions (3) and (4), depicted below.

   (3)

   (4)

Reaction (3) results in the undesirable deposition of carbon powder on the refractory surface and on the surrounding ceramic surface (e.g., in a chip carrier application). Reaction (4) results in the undesirable formation of metal oxide on the refractory surface, thereby inactivating the surface and hindering subsequent electroless deposition of another metal.

The relative proportions of carbon and the other components in the carburizing atmosphere may be readily determined and adjusted at a given temperature according to calculations based on the equilibrium constant of the particular refractory metal carbide-forming reaction being utilized. For example, the equilibrium condition for reaction (2) may be expressed by the following equation:

$$[W_c] = \frac{K_c[W][CH_4]}{[H_2]^2},$$

the brackets signifying the concentration of each species. $K_c$, the equilibrium constant, varies only when the reaction temperature is changed. Thus, since the amount of tungsten present on the surface is known or can be easily calculated, the thermodynamic favorableness of tungsten carbide formation may be stoichiometrically calculated. Knowledge of the value of the equilibrium constant allows the practitioner to calculate the ratio of hydrogen to methane that may be present in the carburizing atmosphere. The equilibrium theory upon which these calculations are based is well-known in the thermodynamics field and need not be described in detail here. Full explanations of this theory and its practical applications are provided in many texts, such as H. E. LeMay, Jr., *Chemistry: The Central Science,* 1977, Prentice-Hall, Inc., pp. 406–428. Furthermore, thermodynamic data upon which calculations of $K_c$ are made is available in various texts, such as I. Barin's *Thermochemical Properties of Inorganic Substances,* Springer Verlay, 1973. The information in these sources is incorporated herein by reference.

Those acquainted with equilibrium theory readily appreciate that the above-expressed equilibrium equation may be simply extended to accommodate other gases which may be present in a carburizing atmosphere, such as carbon monoxide, carbon dioxide, oxygen, and the like. Generally, the carbon activity in a particular carburizing reaction should be maintained as close as possible to, but less than, 1.0. Furthermore, a change in reaction temperature may require adjustment according to the equilibrium equation. In practice, reaction temperature, gas components, and relative gas concentrations based on the thermodynamic considerations may be optimized by test trials on refractory metal surfaces. Optimal conditions may be determined without undue experimentation by analytical inspection of the refractory surface after treatment, and by inspection of metal layers subsequently plated onto such surfaces, as further described in the examples below.

As mentioned above, the selection of particular components for the carburizing atmosphere depends in part on the type and condition of the refractory substrate, as well as upon the degree of catalytic activation required. For example, a methane atmosphere may alone be sufficient to carburize and thus activate a tungsten surface. However, tungsten surfaces often contain substantial amounts of tungsten oxide which will not easily be converted to the desired tungsten carbide or ditungsten carbide when exposed to methane alone. In that instance, hydrogen gas, as discussed above, may be utilized in the carburizing atmosphere as a convenient reducing agent to convert any tungsten oxide to tungsten metal, the latter then being converted to tungsten carbide and/or ditungsten carbide. In general, the preferred carburizing composition for treating a tungsten or molybdenum surface comprises hydrogen and methane. Furthermore, the preferred volume ratio of hydrogen to methane is from about 98:2 to about 80:20, with 95:5 being most preferred. The hydrogen quantity as expressed here excludes hydrogen which is part of the methane molecule or which is derived from any other source.

In some embodiments of the present invention, the carburizing atmosphere further comprises oxygen. Oxygen is often desirable in that its presence inhibits reaction (3), i.e., the undesirable deposition of elemental carbon. The amount of oxygen present (as expressed in partial pressure) in the carburizing atmosphere is generally small, i.e., less than about $10^{-23}$ atmosphere when the substrate temperature is about 900° C. to about 975° C.; and less than about $10^{-18}$ atmosphere when the substrate temperature is about 975° C. or higher. Keeping the oxygen level low helps to prevent the undesirable consequences of reaction (4), i.e., metal oxide formation. The oxygen may conveniently be supplied in the form of water vapor.

Another suitable carburizing gas mixture for the present invention may comprise methane, carbon monoxide, carbon dioxide, hydrogen, and nitrogen. For such a mixture, a suitable molar ratio of components is as follows:

methane: 2–4 mole %
carbon monoxide: 6–18 mole %
carbon dioxide: 6–18 mole %
hydrogen: 16–28 mole %
nitrogen: 40–60 mole %

Nitrogen is utilized here as a carrier gas, and might be replaced by similar quantities of argon or helium. As discussed above, specific quantities of each gas component may be determined by those skilled in the art based upon the thermodynamic expressions described above, and also based upon the appearance and properties of test samples upon which another metal has been electrolessly applied.

Still another suitable gas mixture for the present invention comprises about 93 mole % pure hydrogen, about 5 mole % propane, and about 2 mole % water. Tungsten is carburized very effectively with this composition when the substrate temperature is about 1025° C. to about 1075° C.

The refractory surface being treated according to the present invention must be heated to a temperature of at least about 900° C. while exposed to the carburizing atmosphere. In general, as the temperature is increased above 900° C., reaction kinetics favor the desirable formation of various refractory metal carbides. Thus, preferred embodiments of the present invention call for temperatures of at least about 1050° C. during the carburizing treatment, the maximum temperature being dictated only by economic considerations.

The particular technique employed for exposing the refractory metal surface to the carburizing atmosphere is not critical to the present invention. For example, the refractory metal substrate may be placed in any type of chamber in which a controlled gas environment can be maintained. A retort equipped with gas inlet and exit passageways may be used to treat refractory surfaces on a small scale. Convection ovens or belt furnaces provide a very suitable treatment environment for larger scale operations.

Prior to the carburizing treatment, the refractory surface may be cleaned and/or etched by any convenient methods when deemed necessary. Illustrative techniques include use of a solvent-based degreaser and a nitric acid or hydrochloric acid etch.

The gaseous reactants which form the carburizing atmosphere may be supplied from any suitable external source through one or more inlet tubes or pipes which contain valve adjustments to control flow into the reactor chamber. The technical particularities of channeling the various gases or gas mixtures into the reactor chamber are well-known in the art and need not be described in detail here. For example, each gas inlet may be connected to a central feed line which carries the gases into the reactor chamber. The flow of gases may be controlled by mass flow control valves which are well-known in the art. Argon or nitrogen gas blankets may be used at the gas entrance and exit sites. Gas flow rates are not particularly critical to the present invention as long as the particular gas concentrations are maintained according to the guidelines described above. Furthermore, the orientation of the substrate surface relative to the direction of gas flow is not critical because the entire chamber is filled with the gas mixture during treatment. However, a laminar flow of the carburizing gases relative to the refractory surface is generally preferred.

After passing over and reacting with the refractory surface, the residual gases (and carrier gas, if present) may be directed out of the chamber through an exit port and then to an exhaust system.

As discussed above, the temperature of the refractory surface should be maintained at at least about 900° C. during treatment with the carburizing atmosphere. In most instances, situating the substrate in the preheated chamber is sufficient to bring the substrate surface to the desired temperature. Optionally, a heating coil may be attached to the substrate to maintain the proper temperature.

Ceramic chip carriers having surfaces catalytically activated by the above-described treatment may then be cooled to ambient temperature and prepared for the electroless plating of nickel or another metal thereon. As described in the following examples, plated articles treated in this manner exhibit the same desirable properties as articles activated by other methods. The following examples are provided to more fully describe this invention. It is intended that these examples be considered as illustrative of the invention, rather than limiting what is otherwise disclosed and claimed herein.

In all of the following examples, examination of the substrate surface was carried out by X-ray diffraction. One of two systems was used for this analysis: a Siemens D500 X-ray Diffractometer or a Rigaku Theta-Theta diffractometer, D-MAX Series. Such equipment provides an analysis of about 1.0 $\mu$m into the surface, and thus depicts a major phase of the underlying refractory material and a minor phase of the metal carbide formed on the surface.

EXAMPLE 1

This example demonstrates the treatment of tungsten in various forms according to the present invention. Samples for Runs 1–4 consisted of portions of tungsten oxide ($WO_2$) powder as the substrate to be treated. About 2 grams were placed on a plate in an Inconel retort which in turn was inserted into a Lindberg electric furnace. The furnace temperature was adjusted to maintain the temperature of the powder as indicated in Table 1.

A carburizing gas composition was fed through the retort at a flow rate of about 1 scfh. The results of X-ray analysis after the samples were treated and cooled to ambient temperature is also provided in Table 1.

Samples for Runs 5–9 were ceramic chip carriers having a tungsten metallization layer (about 10 microns thick) screen printed on a ceramic surface which was then cofired. The samples were randomly placed in the above-described retort system and treated according to the conditions indicated in Table 1. Analysis was carried out on representative samples for each run.

Samples for Run 10 were strips of tungsten foil having a thickness of about 10 mils, while samples for Run 11 were portions of tungsten oxide powder treated under the indicated conditions in a production-scale Lindberg electric furnace.

The following results were obtained:

TABLE 1

| | | Treatment of Tungsten and Tungsten Oxide Substrates | | |
|---|---|---|---|---|
| Run No. | Temp.[a] (°C.) | Gas Composition[b] | Substrate | Results[c] |
| (1) | 1000 | 93% $H_2$, 2% $H_2O$, 5% $CH_4$ | $WO_2$ Powder | W major, $W_2C$ minor, WC trace |
| (2) | 900 | 93% $H_2$, 2% $H_2O$, 5% $CH_4$ | $WO_2$ Powder | W major, Trace $WO_2$ |
| (3) | 1000 | 93% $H_2$, 2% $H_2O$, 5% $CH_4$ | $WO_2$ Powder | W major, $W_2C$ minor |
| (4) | 1050 | 93% $H_2$, 2% $H_2O$, 5% $CH_4$ | $WO_2$ Powder | W, WC $W_2C_{14}$ |
| (5) | 900 | 93% $H_2$, 2% $H_2O$, 5% $CH_4$ | Parts | W major, no WC observed |
| (6) | 1000 | 93% $H_2$, 2% $H_2O$, 5% $CH_4$ | Parts | W major, $W_2C$ minor |
| (7) | 1000 | 98% $H_2$, 2% $H_2O$, 0% $CH_4$ | Parts | W major, no trace phases |
| (8) | 1000 | 98% $H_2$, 2% $H_2O$, 0% $CH_4$ | Parts | W, no $W_2C$, no WC |
| (9) | 1050 | 93% $H_2$, 2% $H_2O$, 5% $CH_4$ | Parts | Part, W, $W_2C$, WC |
| (10) | 1050 | 93% $H_2$, 2% $H_2O$, 5% $CH_4$ | W Foil | W major, WC minor |
| (11) | 1050 | 93% $H_2$, 2% $H_2O$, 5% $C_3H_8$ | $WO_2$ | W major, $W_2C$ minor |

[a]Temperature on substrate surface.
[b]Volume %.
[c]Based on the relative intensity of the X-ray diffraction lines.

The carburizing gas environment and temperature in Run 1 were sufficient to reduce the tungsten oxide to tungsten and then cause the formation of ditungsten carbide and tungsten carbide on the powder surface.

A comparison of Runs 2–6 demonstrates that for the particular substrates and gas mixtures used therein, raising the reaction temperature promotes the formation of various tungsten carbides on the refractory surface.

Bath B was a commercial electroless nickel plating composition referred to as an Allied Kellite 752Ni plating bath.

TABLE 2

Electroless Nickel Plating on Carburized Tungsten Surfaces

| Run No. | Carburizing Temp. (°C.) | Gas Composition[a] | Bath Temp. (°C.) | Bath | Results |
|---|---|---|---|---|---|
| (12) | None | — | 93 | A | Spotty: nickel was dark |
| (13) | 1200 | 95% $H_2$, 5% $CH_4$ | 93 | A | All W plated, some $Al_2O_3$ plated, Ni metallic gray |
| (14) | 1000 | 93% $H_2$, 5% $CH_4$, 2% $H_2O$ | 80 | A | All W plated, Ni metallic gray |
| (15) | 1000 | 93% $H_2$, 5% $CH_4$, 2% $H_2O$ | 70 | B | 50 parts, all 50 plated in all areas, no unplated areas |
| (16) | 900 | 93% $H_2$, 5% $CH_4$, 2% $H_2O$ | 70 | B | 10 parts, several unplated |
| (17) | 1000 | 93% $H_2$, 5% $CH_4$, 2% $H_2O$ | 70 | B | 10 parts, all plated, no unplated areas |
| (18) | 1050 | 93% $H_2$, 5% $CH_4$, 2% $H_2O$ | 70 | B | 2,000 parts, almost all plated; only 7 parts showed unplated areas |

[a]Volume ratios.
A - Bath of Serial No. 890,050.
B - Allied Kellite 752 Ni.

Runs 7 and 8 demonstrate that if a carbon source is not present in the gas mixture, carburization on the refractory surface does not occur.

Run 10 was a repeat of Run 4, with the substitution of tungsten foil (Alfa Chemicals Company) instead of the tungsten-ceramic part. After tungsten carbide was formed on the foil surface, portions of the foil were independently immersed in nitric acid and potassium hydroxide solutions. The samples exhibited a high degree of stability in the aggressive medium of each solution. For example, X-ray diffraction examination indicated that oxide formation was not present, in contrast to the typical occurrence of oxide on tungsten. Furthermore, the foil remained active for subsequent nickel plating.

Run 11 demonstrates the suitability of utilizing propane rather than methane as the carbon source.

EXAMPLE 2

Nickel was electrolessly plated onto various tungsten surfaces treated according to the present invention. Carburizing treatment conditions are provided in Table 2. The tungsten surface in each instance was a base metallization layer screen printed and cofired on a ceramic substrate.

One of two electroless nickel plating baths was used as indicated. Bath A was a nickel plating bath of the type disclosed in the copending and commonly assigned application of C. Iacovangelo and K. Zarnoch, Ser. No. 890,050, filed July 28, 1986, and incorporated herein by reference. The bath contained water, nickel acetate tetrahydrate, monoethanolamine, and hydrazine monohydrate.

Samples for Runs 12 and 13 are a comparison of parts plated with and without the carburizing treatment of the present invention. Those results demonstrate that in the absence of this treatment, nickel plating on tungsten was very sporadic; and the general appearance of any nickel which did plate was unacceptable. When the treatment was used in Run 13, all of the tungsten surface was plated with a desirable metallic gray coating of nickel. However, some of the surrounding alumina surface was also plated with nickel.

Plating of these alumina portions of carrier surfaces was prevented by the addition of water vapor to the carburizing gas environment, as shown for samples in Run 14. As discussed above, oxygen from the water vapor prevented the deposition of elemental carbon on any portion of the chip carrier surface.

Samples for Runs 15–18, which were plated in the commercial nickel plating bath, demonstrate the reproducibility of plating results obtained after treatment by the present invention. In particular, Runs 15, 17 and 18 demonstrate that use of this process generally results in the complete plating of all desired areas when the indicated carburizing and plating conditions are employed. In Run 16, use of the borderline carburizing temperature of 900° C. resulted in the activation of most, but not all, of the substrates.

While the invention has been described with respect to preferred embodiments, it will be apparent that certain modifications and changes can be made without departing from the spirit and scope of the invention. For example, the refractory material might be in the form of a powder rather than a planar layer or substrate for treatment according to the present invention. In general, it is intended that the foregoing disclosure be limited only by the claims appended hereto.

What is claimed is:

1. A method of catalytically activating a refractory metal surface for the subsequent electroless plating of metal thereon; said method comprising treating the surface while heated in a carburizing atmosphere under conditions which cause carbon to react with refractory metal atoms at the surface, said carburizing treatment followed by the electroless plating of a metal selected from the group consisting of nickel, cobalt, and gold onto the refractory surface.

2. The method of claim 1 wherein a surface of a refractory metal selected from the group consisting of tungsten and molybdenum is heated to a temperature of at least about 1050° C. in the carburizing atmosphere.

3. The method of claim 1 wherein the refractory metal is tungsten.

4. The method of claim 3 wherein the carburizing atmosphere comprises methane and hydrogen.

5. The method of claim 4 wherein the carburizing atmosphere further comprises oxygen.

6. The method of claim 5 wherein the surface is heated to a temperature of at least about 1050° C. in the carburizing atmosphere; and the partial pressure of oxygen is maintained at less than about $10^{-18}$ atmospheres.

7. The method of claim 5 wherein the volume ratio of methane to hydrogen is about 5:95.

8. The method of claim 4 wherein the carburizing atmosphere further comprises oxygen, carbon dioxide, and carbon monoxide.

* * * * *